(12) United States Patent
Fukuda et al.

(10) Patent No.: US 6,413,887 B1
(45) Date of Patent: Jul. 2, 2002

(54) METHOD FOR PRODUCING SILICON NITRIDE SERIES FILM

(75) Inventors: Hideaki Fukuda; Hiroki Arai, both of Tama (JP)

(73) Assignee: ASM Japan K.K., Tama (JP)

( * ) Notice: Subject to any disclaimer, the term of this patent is extended or adjusted under 35 U.S.C. 154(b) by 23 days.

(21) Appl. No.: 09/650,168

(22) Filed: Aug. 29, 2000

(30) Foreign Application Priority Data

Aug. 30, 1999 (JP) .............................. 11-243914

(51) Int. Cl.$^7$ .............................................. H01L 21/31
(52) U.S. Cl. .................... 438/792; 438/791; 438/909
(58) Field of Search .................... 438/791, 778, 438/909, 792, 758

(56) References Cited

U.S. PATENT DOCUMENTS 3,652,324 A * 3/1972 Chu et al. ................... 117/106
4,770,963 A * 9/1988 Pai et al. ....................... 430/64
4,866,746 A * 9/1989 Nakahigashi et al. ......... 378/35
2001/0024867 A1 * 9/2001 Saida et al. .................. 438/490

* cited by examiner

*Primary Examiner*—Richard Elms
*Assistant Examiner*—Adam Pyonin
(74) *Attorney, Agent, or Firm*—Knobbe, Martens Olson and Bear, LLP

(57) ABSTRACT

A method for producing a plasma silicon nitride series film with a small heat load having a low hydrogen concentration is provided. The method is for producing a silicon nitride series film on a material to be treated using a plasma CVD apparatus having a reaction chamber evacuated to vacuum. The method comprises the steps of introducing a monosilane gas ($SiH_4$) and a nitrogen gas ($N_2$) as raw material gases into the reaction chamber at prescribed flow rates, and heating the material to be treated to a prescribed temperature. At this time, it is characterized in that the flow rate of the nitrogen gas is at least 100 times the flow rate of the monosilane gas.

6 Claims, 2 Drawing Sheets

METHOD FOR PRODUCING SILICON NITRIDE SERIES FILM

FIELD OF THE INVENTION

The present invention relates to a process for producing a semiconductor device, and more particularly, it relates to a film formation process of an interlayer insulation film of multilayer interconnection.

BACKGROUND OF THE INVENTION

A silicon nitride film or a silicon oxinitride film (hereinafter referred to as a silicon nitride series film) formed by a capacity coupling type plasma CVD process has been industrially used as a dielectric film of a semiconductor device. The film formation is conducted under such conditions that the gas flow rate ratio of $SiH_4$, $N_2$ and $NH_3$, which are reaction gases, $SiH_4:N_2:NH_3$ is 1:1~50:1~10, and the processing temperature is about 400° C. or lower. The film formation conditions are disclosed, for example, in U.S. Pat. No. 5,336,640. The film contains a large amount of hydrogen in the film, and when the step subsequent to the film formation step is conducted at a temperature higher than that of the film formation step, the hydrogen contained in the film is released to adversely affect the electric properties of the semiconductor device. Therefore, the application of the film is mainly a final passivation film of a semiconductor device. (The application shown in the U.S. Patent is those for a final passivation film.)

On the other hand, in order to solve the problem of increasing interconnection's RC delay (which is proportional to the product of the interconnection resistance and the capacity between interconnections) associated with fine structures of a semiconductor device, as interlayer insulation film, the use of an SiOF film formed by doping a conventional silicon oxide film with fluorine or a siloxane series film having a low dielectric constant containing a methyl group is examined for reducing the interconnection capacity. A high quality SiOF film formed by a dual frequency excited capacity coupling plasma CVD is disclosed in "Water Absorption Properties of Fluorine-Doped $SiO_2$ Film Using Plasma-Enhanced Chemical vapor Deposition", Japanese Journal of Applied Physics, vol. 35, No. 12A, p. 6217–6225 (1996) incorporated herein for reference. This discloses that an SiOF film having a low dielectric constant exhibiting no water adsorption with the lapse of time is formed by a conventional plasma CVD apparatus at a relatively high temperature of about 470° C.

However, because a conventional aluminum (Al) interconnection cannot withstand at a high temperature of 470° C., the SiOF film has not been applied to a semiconductor device using the Al interconnection.

Thus, in order to reduce the-RC delay, a copper (Cu) interconnection having a lower resistance than Al is being used. The Cu interconnection has higher heat resistance than Al and can be used as an interlayer insulation film. The Cu interconnection is formed in such a manner that a groove pattern is formed on an interlayer insulation film, and the Cu interconnection is buried in the grooves (i.e., a damascene process). The formation of the groove pattern on the interlayer insulation film is conducted by anisotropic etching using reactive ion etching (RIE). The use of the silicon nitride series film formed by the plasma CVD as an etching stopper layer for RIE is being considered.

The silicon nitride series film formed by plasma CVD is also used as an anti-reflection film in a lithography process for preventing reflection of exposure light at a lower part of a resist to conduct fine fabrication with high accuracy.

The silicon nitride series film can also be formed by thermal CVD. Although the film cannot be used as an interlayer insulation film after the formation of Al or Cu since the film formation temperature is 700° C. or higher, it has been applied to an etching stopper layer for an interlayer insulation film as the first layer directly on the semiconductor device, which is subsequently subjected to a heat treatment step.

In the case where the conventional silicon nitride series film by plasma CVD is formed as the etching stopper layer for RIE on formation of the interconnection grooves or the anti-reflection film, when an SiOF film formed at a relatively high film formation temperature (470° C.) is formed on the silicon nitride series film, hydrogen contained in the silicon nitride series film is released to deteriorate the adhesion of the film, so as to cause detachment of the film. The detachment of the film causes a short-circuit or connection failure of the interconnection of the semiconductor device containing the part of detachment, and thus brings about deterioration of the yield.

On the other hand, the silicon nitride series film formed by thermal CVD contains substantially no hydrogen, but in the case of a device having a fine gate length of 0.18 $\mu$m or less, the diffusion control of the impurity layer becomes difficult due to the heat load at the temperature of 700° C. or higher. In such a case, the reliability of the semiconductor device is considerably decreased, for example, by causing scattering in operation voltage of the semiconductor device.

SUMMARY OF THE INVENTION

Therefore, an object of the invention is to provide a process for producing a plasma silicon nitride series film having a low hydrogen concentration with a small heat load.

Another object of the invention is to form a silicon nitride series film having high reliability with an yield that is not decreased.

In order to accomplish the objects, a method of the invention consists of following steps.

The method for producing a silicon nitride series film on a material to be treated using a plasma CVD apparatus having a reaction chamber evacuated to vacuum, comprising the steps of:

introducing a monosilane gas ($SiH_4$) and a nitrogen gas ($N_2$) as raw material gases into the reaction chamber at prescribed flow rates; and subjecting the material to be treated to a heat treatment at a prescribed temperature, the flow rate of the nitrogen gas being at least 100 times the flow rate of the monosilane gas.

The silicon nitride series film may be specifically SiN:H or SiON:H.

The prescribed temperature is preferably from 390 to 600° C.

DESCRIPTION OF THE PREFERRED EMBODIMENTS

The invention will be described with reference to the drawings.

Figure 1:
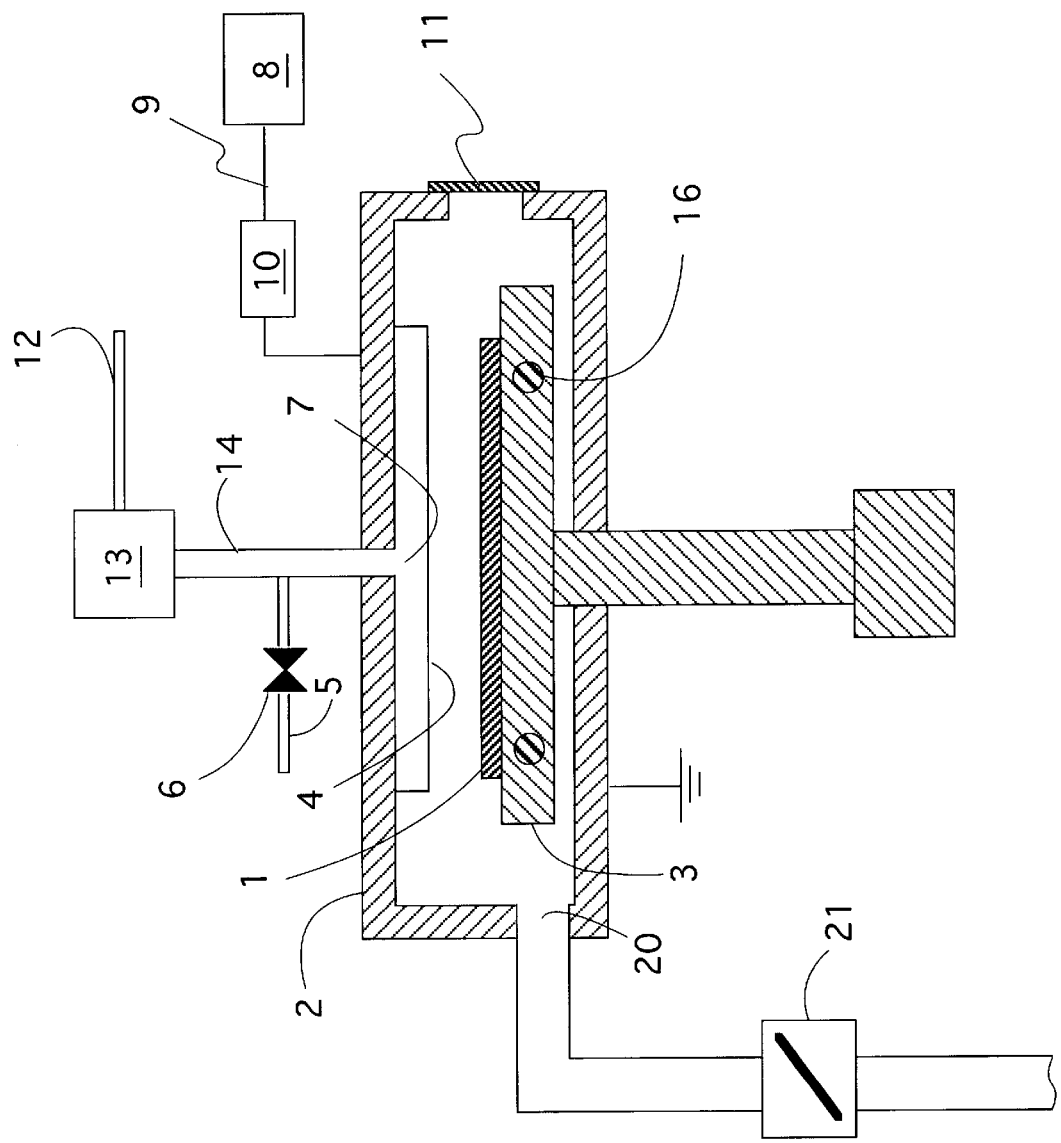
FIG. 1 is a schematic cross sectional view showing an example of a plasma CVD apparatus for conducting the method of the invention.

FIG. 1 is a schematic view showing an example of a parallel plane type plasma CVD apparatus for conducting the method of the invention. The apparatus comprises a reaction chamber 2, a susceptor 3 arranged inside the reaction chamber 2 and on which a semiconductor substrate 1 is mounted, a resistance heater 16 provided inside the susceptor 3, a showerhead 4 provided inside the reaction chamber 2 and facing the susceptor 3 in parallel, an exhaust opening 20, aconductance adjusting valve 21 connected to an external vacuum pump (not shown), a gate valve 11 for carrying the semiconductor substrate 1 in or out the reaction chamber 2, a remote plasma discharge device 13 connected to the showerhead 4 through a piping 14, a piping 12, one end of which is connected to the remote plasma discharge device 13, a piping 5, one end of which is connected to the piping 14, a valve 6 arranged between both ends of the piping 5, and a radio frequency (RF) generator 8 and a matching circuit 10 communicated with each other through an output cable 9.

The reaction gases for forming a film on the surface of the semiconductor substrate 1 are controlled to the prescribed flow rates thereof by a mass flow controller (not shown) and then uniformly supplied into the reaction chamber through the piping 5, the valve 6, an upper opening 7 of the reaction chamber 2, and the showerhead 4.

A cleaning gas for cleaning attachments inside the reaction chamber 2 is controlled to the prescribed flow rate thereof and then introduced into the remote plasma discharge device 13 via the piping 12. The cleaning gas thus activated by the remote plasma discharge device 13 is introduced to the upper opening 7 of the reaction chamber 2 via the piping 14. The activated cleaning gas introduced into the reaction chamber 2 via the opening 7 is uniformly supplied into the reaction chamber 2 through the showerhead 4.

The susceptor 3 and the showerhead 4 function as electrodes of a RF voltage and supply RF power to the space therebetween from the RF generator 8 to form a plasma region.

The method for producing a silicon nitride series film of the invention will be described below. $SiH_4$, $NH_3$ and $N_2$ are introduced as reaction gases into the piping 14 via the piping 5 through the valve 6. The reaction gases are mixed with $N_2$ introduced into the piping 14 via the piping 12 through the remote plasma discharge device 13 and are uniformly supplied to the reaction chamber 2 from the opening 7 through the showerhead 4. As the RF power, electric power only of 13.56 MHz or mixed electric power of 13.56 MHz and 430 kHz is applied to the showerhead 4. The semiconductor substrate 1 receives heat from the heated susceptor 3 and is heated to a desired temperature. The pressure inside the reaction chamber is adjusted to a range of from 1 to 8 Torr depending on the desired flow rates ratio of the reaction gases by controlling the travel of the conductance adjusting valve 21.

As described above, the desired RF power is applied to the electrodes to form plasma while controlling the reaction temperature, the flow rates of the reaction gases and the reaction pressure to the desired values, whereby the silicon nitride series film is formed on the semiconductor substrate. A desired thickness of the film can be obtained by controlling the period of time for applying the RF power. After completion of the formation of the film on the semiconductor film 1, the semiconductor substrate 1 is carried out of the reaction chamber by an automatic transportation robot (not shown) through the gate valve 11.

Unnecessary attachments attached inside the reaction chamber after conducting the formation of the film on the semiconductor substrate 1 is cleaned by a cleaning sequence.

A cleaning gas containing fluorine is controlled to the desired flow rate and introduced to the remote plasma discharge device 13 via the piping 12. In the remote plasma discharge device 13, RF output of from 300 to 500 kHz is applied to the cleaning gas at electric power of from 1,000 to 5,000 W to dissociate and activate the cleaning gas. The activated cleaning gas is introduced into the reaction chamber 2 through the piping 14 and conducts cleaning of the attachments remaining in the reaction chamber.

The invention will be described in more detail with reference to the examples.

The film formation conditions for the examples of the silicon nitride series films according to the invention and those for the conventional example are summarized in Table 1. In Conventional Example and Examples 1 to 6, the film forming pressure was set at 4 Torr, the RF power had 13.56 MHz and 450 W, and the distance between the electrodes was 14 mm. As the plasma CVD apparatus, Eagle 10 (produced by ASM Japan K.K.) was used.

TABLE 1

|  | $SiH_4$ (sccm) | $N_2$ (sccm) | $N_2/SiH_4$ | $NH_3$ (sccm) | Pressure (Torr) | RF power (W) | Distance between electrodes (mm) | Temperature (° C.) |
|---|---|---|---|---|---|---|---|---|
| Conventional Example | 60 | 1,500 | 25 | 600 | 4 | 450 | 14 | 390 |
| Example 1 | 25 | 2,500 | 100 | 0 | 4 | 450 | 14 | 390 |
| Example 2 | 25 | 3,600 | 144 | 0 | 4 | 450 | 14 | 390 |
| Example 3 | 25 | 5,000 | 200 | 0 | 4 | 450 | 14 | 390 |
| Example 4 | 25 | 5,000 | 200 | 0 | 4 | 450 | 14 | 435 |
| Example 5 | 25 | 5,000 | 200 | 0 | 4 | 450 | 14 | 470 |
| Example 6 | 25 | 5,000 | 200 | 0 | 4 | 450 | 14 | 600 |

EXPERIMENTAL CONDITIONS

(1) Conventional Example

Flow rate of $SiH_4$: 60 (sccm)
Flow rate of $N_2$: 1,500 (sccm)
$N_2/SiH_4$: 25
Flow rate of $NH_3$: 600 (sccm)
Temperature: 390° C.

(2) Example 1

Flow rate of $SiH_4$: 25 (sccm)
Flow rate of $N_2$: 2,500 (sccm)
$N_2/SiH_4$: 100
Flow rate of $NH_3$: 0 (sccm)
Temperature: 390° C.

(3) Example 2

Flow rate of $SiH_4$: 25 (sccm)
Flow rate of $N_2$: 3,600 (sccm)
$N_2/SiH_4$: 144
Flow rate of $NH_3$: 0 (sccm)
Temperature: 390° C.

(4) Example 3

Flow rate of $SiH_4$: 25 (sccm)
Flow rate of $N_2$: 5,000 (sccm)
$N_2/SiH_4$: 200
Flow rate of $NH_3$: 0 (sccm)
Temperature: 390° C.

(5) Example 4

Flow rate of $SiH_4$: 25 (sccm)
Flow rate of $N_2$: 5,000 (sccm)
$N_2/SiH_4$: 200
Flow rate of $NH_3$: 0 (sccm)
Temperature: 435° C.

(6) Example 5

Flow rate of $SIH_4$: 25 (sccm)
Flow rate of $N_2$: 5,000 (sccm)
$N_2/SiH_4$: 200
Flow rate of $NH_3$: 0 (sccm)
Temperature: 470° C.

(7) Example 6

Flow rate of $SiH_4$: 25 (sccm)
Flow rate of $N_2$: 5,000 (sccm)
$N_2/SiH_4$: 200
Flow rate of $NH_3$: 0 (sccm)
Temperature: 600° C.

Table 2 shows analytical results of the silicon nitride series films formed by the film formation conditions shown in Table 1. The "Hydrogen releasing gas amount" shown in Table 2 is an amount of hydrogen released from the film when heated from room temperature to 700° C. With respect to the "Adhesion after heat treatment", the silicon nitride series film formed on a silicon wafer was subjected to a heat treatment in a nitrogen atmosphere at 550° C. for 1 hour, and then observed with an optical microscope to observe the presence or absence of peeling-off of the film, micro-cracks and the like for the determination of non-defective and defective.

TABLE 2

| | $N_2/SiH_4$ | Temperature (° C.) | Hydrogen releasing gas amount (arbitrary unit) | Adhesion after heat treatment |
|---|---|---|---|---|
| Conventional Example | 25 | 390 | 8.12 | defective |
| Example 1 | 100 | 390 | 0.80 | non-defective |
| Example 2 | 144 | 390 | 0.76 | non-defective |
| Example 3 | 200 | 390 | 0.67 | non-defective |
| Example 4 | 200 | 435 | 0.55 | non-defective |
| Example 5 | 200 | 470 | 0.32 | non-defective |
| Example 6 | 200 | 600 | 0.19 | non-defective |

Conventional Example indicates the film formation conditions of the silicon nitride film used as a final passivation film of a semiconductor device. $SliH_4$, $N_2$ and $NH_3$ were used as the reaction gases. It is understood from the results of Table 2as follows. The hydrogen releasing gas amount of Conventional Example was considerably larger than those of Examples. The ratio of the flow rate of $N_2$ to the flow rate of $SiH_4$ was about 25 times in Conventional Example, and detachment of the silicon nitride film from the semiconductor substrate was observed after the heat treatment at 550° C. In Examples, $NH_3$was removed from the reaction gas and the flow rate of $N_2$ was increased with respect to the flow rate of $SiH_4$, whereby it was understood that the amount of a hydrogen gas released from the film was decreased.

In Examples 1 to 3, the film formation was conducted where the flow rate of $N_2$ with respect to $SiH_4$ was 100 times, 144 times or 200 times. As shown in Table 2, the releasing gas amount of hydrogen from the film was gradually decreased, and the adhesion to the semiconductor substrate was improved. It is understood from the results that Examples 1, 2 and 3 satisfy the adhesion of the film that is required as for the etching stopper layer of the interlayer insulation film between metallic interconnections or the anti-reflection film.

In Examples 4 to 6, the silicon nitride film formation was conducted where the flow rate of $N_2$ with respect to $SiH_4$ was fixed at200 times, and the temperature on the film formation was 4350° C., 470° C. or 600° C., respectively. It is understood from the results that when the film formation is conducted at higher temperatures of 430° C. or higher, the releasing gas amount of hydrogen from the film is gradually decreased in comparison to Examples 1 to 3.

Figure 2:
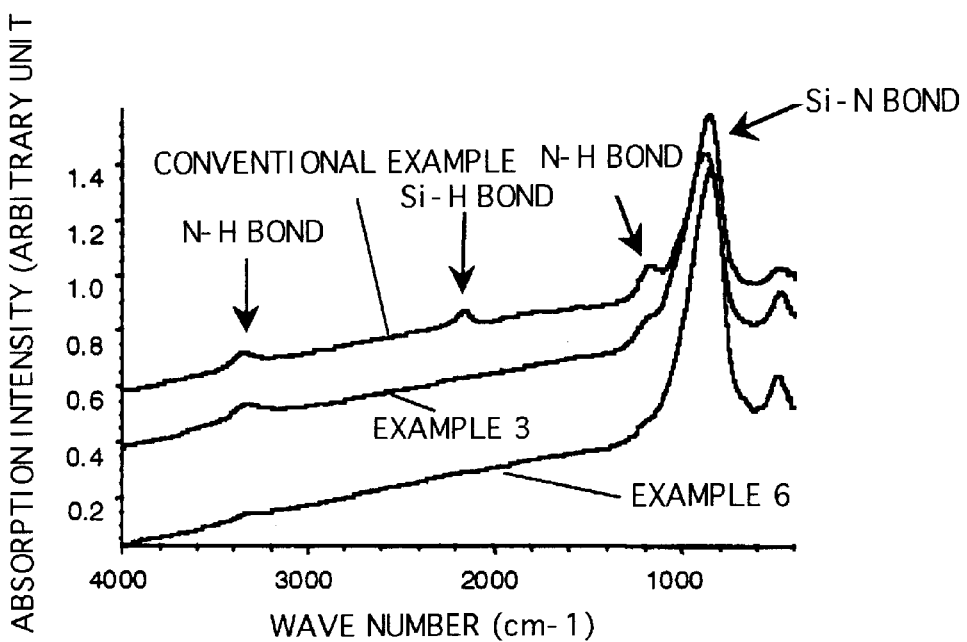
FIG. 2 is a diagram showing FT-IR spectra of Conventional Example, Example 3 and Example 6.

FIG. 2 is a diagram showing FT-IR spectra of Conventional Example, Example 3 and Example 6. The areas of the absorption intensities for the Si—H bond or the Si—N bond in the FT-IR spectrum are proportional to the amounts of the existing bonds.

It is understood from the comparison between Conventional Example and Example 3 that there is a great difference in area of the Si—H bond. This is because as the flow rate of $N_2$ is 100 times or more that of $SiH_4$, the amount of Si—H bond having relatively low bond energy can be decreased in the film by effectively introducing ion bombardment of $N_2^+$ ions in the plasma.

When Example 3 and Example 6 are compared with each other, the film formation temperatures thereof are 390° C. and 600° C., respectively. With respect to the N—H bond, the amount of the N—H bond in Example 6 is smaller than that in Example 3. This is because the amount of the N—H bond can be decreased by accelerating the thermal reaction.

As described above, when the amount of the $N_2$ gas is 100 times or more that of the $SiH_4$ gas, and the film formation temperature is 390° C. or more, the Si—H bond or the N—H bond can be reduced, and the releasing gas amount of hydrogen on the heat treatment can be reduced to less than 1/10. It is understood, as a result, that the adhesion of the film to the semiconductor substrate is also maintained satisfactory.

A film having a low hydrogen concentration according to the object can be formed by arbitrarily selecting the gas flow rate ratio of $SiH_4$ and $N_2$ and the film forming temperature. For example, because the silicon nitride film of Example 6 is formed at an extremely high temperature of 600° C., it is difficult to use as an etching stopper layer, for an interlayer film of Cu interconnection, but is suitable as an etching stopper layer or the anti-reflection film directly on the semiconductor device that are required to have a low hydrogen concentration.

The film formation conditions for the examples of the silicon oxide nitride films according to the invention are summarized in Table 3. In Conventional Example and Examples 7 and 8, the film forming pressure was set at 4 Torr, the RF power had 13.56 MHz and 450 W, and the distance between the electrodes was 14 mm. As the plasma CVD apparatus, Eagle 10 (produced by ASM Japan K.K.) was used.

TABLE 3

|  | $SiH_4$ (sccm) | $N_2$ (sccm) | $N_2/SiH_4$ | $N_2O$ (sccm) | Pressure (Torr) | RF power (W) | Distance between electrodes (mm) | Temperature (° C.) |
|---|---|---|---|---|---|---|---|---|
| Conventional Example | 60 | 1,500 | 25 | 500 | 4 | 450 | 14 | 390 |
| Example 7 | 25 | 5,000 | 200 | 500 | 4 | 450 | 14 | 390 |
| Example 8 | 25 | 5,000 | 200 | 500 | 4 | 450 | 14 | 600 |

EXPERIMENTAL CONDITIONS (1) Conventional Example Flow rate of $SiH_4$: 60 (sccm) Flow rate of $N_2$: 1,500 (sccm) $N_2/SiH_4$: 25 Flow rate of $N_2O$: 500 (sccm) Temperature: 390° C.

(2) Example 7 Flow rate of $SiH_4$: 25 (sccm) Flow rate of $N_2$: 5,000 (sccm) $N_2/SiH_4$: 200 Flow rate of $N_2O$: 500 (sccm) Temperature: 390° C.

(3) e Example 8

Flow rate of $SiH_4$: 25 (sccm)

Flow rate of $N_2$: 5,000 (sccm)

$N_2/SiH_4$: 200

Flow rate of $N_2O$: 500 (sccm)

Temperature: 600° C.

Table 4 shows analytical results of the silicon oxide nitride films formed by the film formation conditions shown in Table 3. As for the measurement of the hydrogen releasing gas amount and the evaluation of the adhesion after heat treatment, the same evaluation methods for the silicon nitride films of abovementioned Examples 1 to 6 were employed.

TABLE 4

|  | $N_2/SiH_4$ | Temperature (° C.) | Hydrogen releasing gas amount (arbitrary unit) | Adhesion after heat treatment |
|---|---|---|---|---|
| Conventional Example | 25 | 390 | 7.22 | defective |
| Example 7 | 200 | 390 | 0.61 | non-defective |
| Example 8 | 200 | 600 | 0.13 | non-defective |

Conventional Example is the silicon oxide nitride film used as a ultraviolet rays through type final passivation film of a semiconductor device. When it was compared with Example 7, the amount of $N_2$ with respect to $SiH_4$ in Example 7 was as large as 200 times, and it was understood that the releasing gas amount of hydrogen from the film was small, and the adhesion was non-defective. As a result, Example 7 satisfies the adhesion of the film that is required as for the etching stopper layer of the interlayer insulation film between metallic interconnections or the anti-reflection film.

Example 7 is then compared with Example 8. In Example 8, the film formation was conducted at a high temperature of 600° C. It is understood that the hydrogen releasing gas amount in Example 8 is smaller than that in Example 7. This is because the releasing gas amount of hydrogen from the film is decreased by conducting the film formation at the high temperature.

Figure 3:
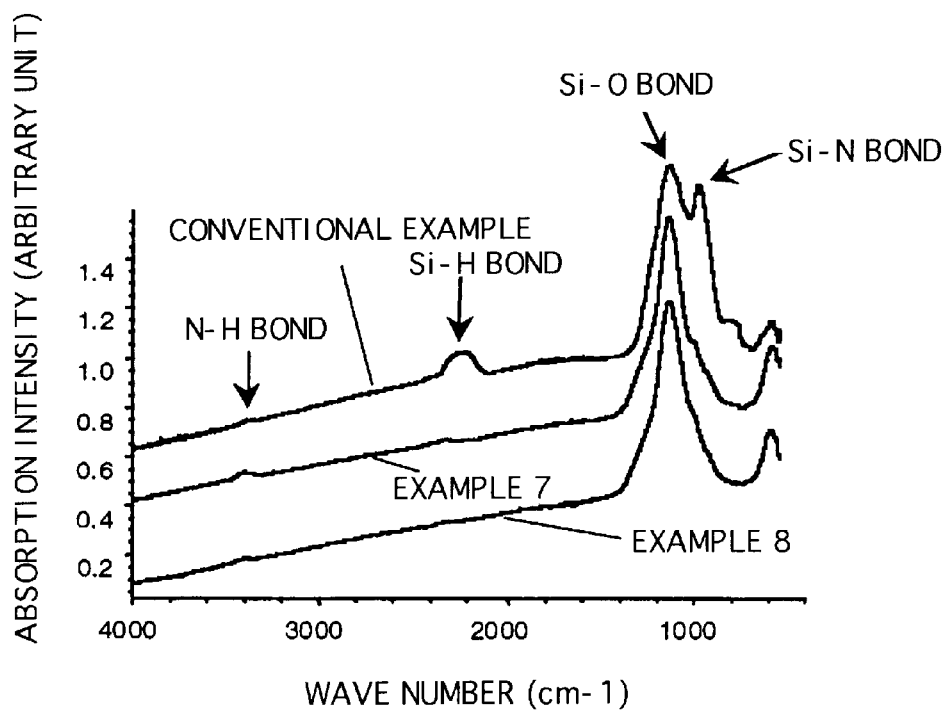
FIG. 3 is a diagram showing FT-IR spectra of Conventional Example, Example 7 and Example 8.

FIG. 3 is a diagram showing FT-IR spectra of Conventional Example, Example 7 and Example 8. With respect to the area of the Si—H bond, Example 7 is smaller than Conventional Example. This is because as the flow rate of $N_2$ is 200 times or more that of $SiH_4$, the amount of Si—H bond having relatively low bond energy can be decreased in the film by effectively introducing ion bombardment of $N_2^+$ ions in the plasma.

When Example 7 and Example 8 are compared with each other, the film formation temperatures thereof are 390° C. and 600° C., respectively. With respect to the N—H bond, the amount of the N—H bond in Example 8 is smaller than that in Example 7. This is because the amount of the N—H bond can be decreased by accelerating the thermal reaction.

As described above, when the amount of the $N_2$ gas is 200 times or more that of the $SiH_4$ gas, and the film formation temperature is 390° C. or more, the Si—H bond or the N—H bond can be reduced, and the releasing gas amount of hydrogen on the heat treatment can be reduced to less than ¹⁄₁₀. It is understood, as a result, that the adhesion of the film to the semiconductor substrate is also maintained satisfactory.

A film having a low hydrogen concentration according to the object can be formed by arbitrarily selecting the gas flow rate ratio of $SiH_4$ and $N_2$ and the film forming temperature. For example, because the silicon nitride film of Example 8 is formed at an extremely high temperature of 600° C., it is difficult to use as an etching stopper layer for an interlayer film of Cu interconnection, but is suitable as an etching stopper layer or the anti-reflection film directly on the semiconductor device that are required to have a low hydrogen concentration.

According to the invention, a plasma silicon nitride series film of high quality with a small heat load having a low hydrogen concentration in the film can be obtained that is suitable as an etching stopper layer and the anti-reflection film for an interlayer insulation film of Cu interconnection or the like, or an etching stopper layer and the anti-reflection film for the insulation film as the first layer directly on the semiconductor device, and thus the yield and the reliability of the semiconductor device are improved.

What is claimed is:

1. A method for producing a silicon nitride series film of SiN:H or SiON:H on a material to be treated using a plasma CVD apparatus having a reaction chamber evacuated to vacuum, said process comprising the steps of:

introducing a monosilane gas ($SiH_4$), a nitrogen gas ($N_2$), and no ammonia gas as raw material gases into said reaction chamber at prescribed flow rates; and heating said material to be treated to a prescribed temperature, said flow rate of said nitrogen gas being at least 100 times said flow rate of said monosilane gas.

2. A method of claim 1, wherein said prescribed temperature is from 390 to 600° C.

3. A method of forming an interlayer insulation film made of a silicon nitride series film on a substrate using a plasma CVD apparatus having a reaction chamber, comprising the steps of:

introducing a monosilane gas and a nitrogen gas into the reaction chamber as raw material gases at a ratio of the nitrogen gas to the monosilane gas of more than 50/1 to reduce Si—H bonds present in a silicon nitride series film to be formed;

heating the substrate at a temperature of 390° C. or higher to reduce N—H bonds present in a silicon nitride series film to be formed; and forming a silicon nitride series film on the substrate.

4. The method according to claim 3, wherein the temperature is lower than 700° C.

5. The method according to claim 4, wherein the ratio is no less than 100/1, and the temperature is in the range of 390° C. to 600° C.

6. The method according to claim 3, wherein the silicon nitride series film is SiN:H or SiON:H.

\* \* \* \* \*